(12) United States Patent
Cadien et al.

(10) Patent No.: US 7,087,188 B2
(45) Date of Patent: Aug. 8, 2006

(54) ABRASIVES FOR CHEMICAL MECHANICAL POLISHING

(75) Inventors: Kenneth C. Cadien, Portland, OR (US); A. Daniel Feller, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 64 days.

(21) Appl. No.: 10/360,254

(22) Filed: Feb. 5, 2003

(65) Prior Publication Data

US 2003/0143851 A1 Jul. 31, 2003

Related U.S. Application Data

(62) Division of application No. 09/473,391, filed on Dec. 28, 1999, now Pat. No. 6,881,674.

(51) Int. Cl.
*C09K 13/00* (2006.01)
(52) U.S. Cl. ................................ 252/79.1; 438/692
(58) Field of Classification Search ........ 438/690–692; 252/79.1–79.5
See application file for complete search history.

(56) References Cited

U.S. PATENT DOCUMENTS

| | | | |
|---|---|---|---|
| 5,209,816 A | 5/1993 | Yu et al. | |
| 5,228,886 A * | 7/1993 | Zipperian | 51/293 |
| 5,332,467 A | 7/1994 | Sune et al. | |
| 5,575,837 A | 11/1996 | Kodama et al. | |
| 5,676,587 A * | 10/1997 | Landers et al. | 451/57 |
| 5,880,018 A | 3/1999 | Boeck et al. | |
| 5,912,217 A * | 6/1999 | Sumiya et al. | 51/307 |
| 5,954,997 A * | 9/1999 | Kaufman et al. | 252/79.1 |
| 5,960,317 A | 9/1999 | Jeong | |
| 6,001,730 A * | 12/1999 | Farkas et al. | 438/627 |
| 6,063,306 A * | 5/2000 | Kaufman et al. | 252/79.4 |
| 6,136,714 A | 10/2000 | Schutz | |
| 6,140,239 A | 10/2000 | Avanzino et al. | |
| 6,387,190 B1 | 5/2002 | Aoki et al. | |
| 6,409,781 B1 * | 6/2002 | Wojtczak et al. | 51/308 |

FOREIGN PATENT DOCUMENTS

| | | |
|---|---|---|
| EP | 0826756 A1 | 3/1998 |
| EP | 0913442 A2 | 5/1999 |
| GB | 2247892 A | 3/1992 |
| GB | 1222133 A | 11/1996 |

(Continued)

OTHER PUBLICATIONS

International Search Report PCT/US 00/31913.
ROC Patent Publication No. 332895, (i.e., ROC Patent Application No. 86106082) and English Translation.

*Primary Examiner*—Kin-Chan Chen
(74) *Attorney, Agent, or Firm*—Blakely, Sokoloff, Taylor & Zafman LLP

(57) ABSTRACT

A slurry for use in polishing a first material having a first hardness, wherein the first material overlies a second material having a second hardness, and the second hardness is greater than the first hardness, includes an abrasive that has a hardness which is greater than that of the first material but less than that of the second material. In a particular embodiment of the present invention copper overlying a copper diffusion barrier is polished with a slurry having an abrasive which is harder than copper but less hard than the copper diffusion barrier. Iron oxide, strontium titanate, apatite, dioptase, iron, brass, fluorite, hydrated iron oxide, and azurite, are examples of materials that are harder than copper but less hard than materials typically used as copper diffusion barriers in integrated circuits.

7 Claims, 3 Drawing Sheets

302
PROVIDE A SLURRY HAVING AN ABRASIVE HARDER THAN A FIRST LAYER AND LESS HARD THAN AN UNDERLYING SECOND LAYER TO POLISHING PAD

304
BRING SUBSTRATE WITH FIRST LAYER THEREON INTO CONTACT WITH POLISHING PAD

306
POLISH FIRST LAYER

308
STOP POLISH ON SECOND LAYER

FOREIGN PATENT DOCUMENTS

| WO | WO 9953532 | 10/1999 |
|----|------------|---------|
| WO | WO 9964527 | 12/1999 |

* cited by examiner

302 — PROVIDE A SLURRY HAVING AN ABRASIVE HARDER THAN A FIRST LAYER AND LESS HARD THAN AN UNDERLYING SECOND LAYER TO POLISHING PAD

304 — BRING SUBSTRATE WITH FIRST LAYER THEREON INTO CONTACT WITH POLISHING PAD

306 — POLISH FIRST LAYER

308 — STOP POLISH ON SECOND LAYER

FIG. 3

ABRASIVES FOR CHEMICAL MECHANICAL POLISHING

This application is a divisional of U.S. application Ser. No. 09/473,391 filed on Dec. 28, 1999, now U.S. Pat. No. 6,881,674 B2.

BACKGROUND OF THE INVENTION

1. Field of the Invention

The present invention relates to the field of chemical mechanical polishing (CMP), and more specifically, to slurries and methods for chemical-mechanical polishing of metal.

2. Background

Advances in semiconductor manufacturing technology have led to the development of integrated circuits having multiple levels of interconnect. In such an integrated circuit, patterned conductive material on one interconnect level is electrically insulated from patterned conductive material on another interconnect level by films of material such as, for example, silicon dioxide. These conductive materials are typically a metal or metal alloy. Connections between the conductive material at the various interconnect levels are made by forming openings in the insulating layers and providing an electrically conductive structure such that the patterned conductive material from different interconnect levels are brought into electrical contact with each other. These electrically conductive structures are often referred to as contacts or vias.

Other advances in semiconductor manufacturing technology have lead to the integration of millions of transistors, each capable of switching at high speed. A consequence of incorporating so many fast switching transistors into an integrated circuit is an increase in power consumption during operation. One technique for increasing speed while reducing power consumption is to replace the traditional aluminum and aluminum alloy interconnects found on integrated circuits with a metal such as copper, which offers lower electrical resistance. Those skilled in the electrical arts will appreciate that by reducing resistance, electrical signals may propagate more quickly through the interconnect pathways on an integrated circuit. Furthermore, because the resistance of copper is significantly less than that of aluminum, the cross-sectional area of a copper interconnect line, as compared to an aluminum interconnect line, may be made smaller without incurring increased signal propagation delays based on the resistance of the interconnect. Additionally, because the capacitance between two electrical nodes is a function of the overlap area between those nodes, using a smaller copper interconnect line results in a decrease in parasitic capacitance. In this way, replacing aluminum based interconnects with copper based interconnects provides, depending on the dimensions chosen, reduced resistance, reduced capacitance, or both.

As noted above, copper has electrical advantages, such as lower resistance per cross-sectional area, the ability to provide for reduced parasitic capacitance, and greater immunity to electromigration. For all these reasons, manufacturers of integrated circuits find it desirable to include copper in their products.

While advantageous electrically, copper is difficult to integrate into the process of making integrated circuits. As is known in this field, copper can adversely affect the performance of metal oxide semiconductor (MOS) field effect transistors (FETs) if the copper is allowed to migrate, or diffuse, into the transistor areas of an integrated circuit. Therefore copper diffusion barriers must be used to isolate copper metal from those transistor areas. Additionally, unlike aluminum based metal interconnect systems which are formed by subtractive etch processes, copper interconnects are typically formed by damascene metal processes. Such processes are also sometimes referred to as inlaid metal processes. In a copper damascene process, trenches are formed in a dielectric layer, a diffusion barrier layer is formed over the dielectric layer, including the trenches and a copper layer is formed over the diffusion barrier layer. Excess copper is then polished off leaving individual copper interconnect lines in the trenches. The removal of the excess copper is typically accomplished by chemical mechanical polishing (CMP). Portions of the barrier layer which reside on a top surface of the dielectric layer are also removed, typically by CMP. Although both copper and portions of the copper diffusion barrier may be removed by CMP, these materials typically have different physical properties which tend to make the conditions which are suitable for polishing one of the materials, less than optimal for polishing the other.

Accordingly, there is a need for CMP methods, materials, and apparatus to polish combinations of layers such as, for example, copper and copper diffusion barriers.

BRIEF DESCRIPTION OF THE DRAWINGS

FIG. 3 is a flowchart showing the operations in a process of polishing a first film of a first hardness which is disposed over a second film of greater hardness, in accordance with the present invention.

DETAILED DESCRIPTION

Briefly, a slurry for use in polishing a first material having a first hardness, wherein the first material overlies a second material having a second hardness, and the second hardness is greater than the first hardness, includes an abrasive that has a hardness which is greater than that of the first material but less than that of the second material.

Such a slurry may also be useful for the case where a softer material overlies a hard material film, which in turn overlies a hard substrate, if the abrasive hardness strategy of the present invention provides a better selectivity to the hard substrate than to the hard material film, then both materials may be successfully removed from the substrate with the slurry of the present invention.

A method and slurry for the chemical-mechanical polishing of copper are described in connection with an exemplary embodiment of the present invention. In the following description numerous specific details are set forth to provide an understanding of the present invention. It will be apparent, however, to those skilled in the art and having the benefit of this disclosure, that the present invention may be practiced with apparatus and processes that vary from those specified here.

Terminology

The terms, chip, integrated circuit, monolithic device, semiconductor device or component, microelectronic device or component, and similar terms and expressions, are often used interchangeably in this field. The present invention is applicable to all the above as they are generally understood in the field.

The terms metal line, trace, wire, conductor, signal path and signaling medium are all related. The related terms listed above, are generally interchangeable, and appear in order from specific to general. In this field, metal lines are sometimes referred to as traces, wires, lines, interconnects or simply metal.

The terms contact and via, both refer to structures for electrical connection of conductors from different interconnect levels. These terms are sometimes used in the art to describe both an opening in an insulator in which the structure will be completed, and the completed structure itself. For purposes of this disclosure contact and via refer to the completed structure.

The expression, low dielectric constant material, refers to a material having a lower dielectric constant than silicon dioxide.

Substrate, as used herein, refers to the physical object that is to be polished by means of the CMP process. A substrate may also be referred to as a wafer. Wafers, may be made of semiconducting, non-semiconducting, or combinations of semiconducting and non-semiconducting materials. Silicon wafers may have thin films of various materials formed upon them. These thin films may be polished with CMP processes. Other substrate materials such as GaAs, silicon-on-sapphire, or silicon on insulator (SOI) may be polished with CMP processes.

Figure 1:
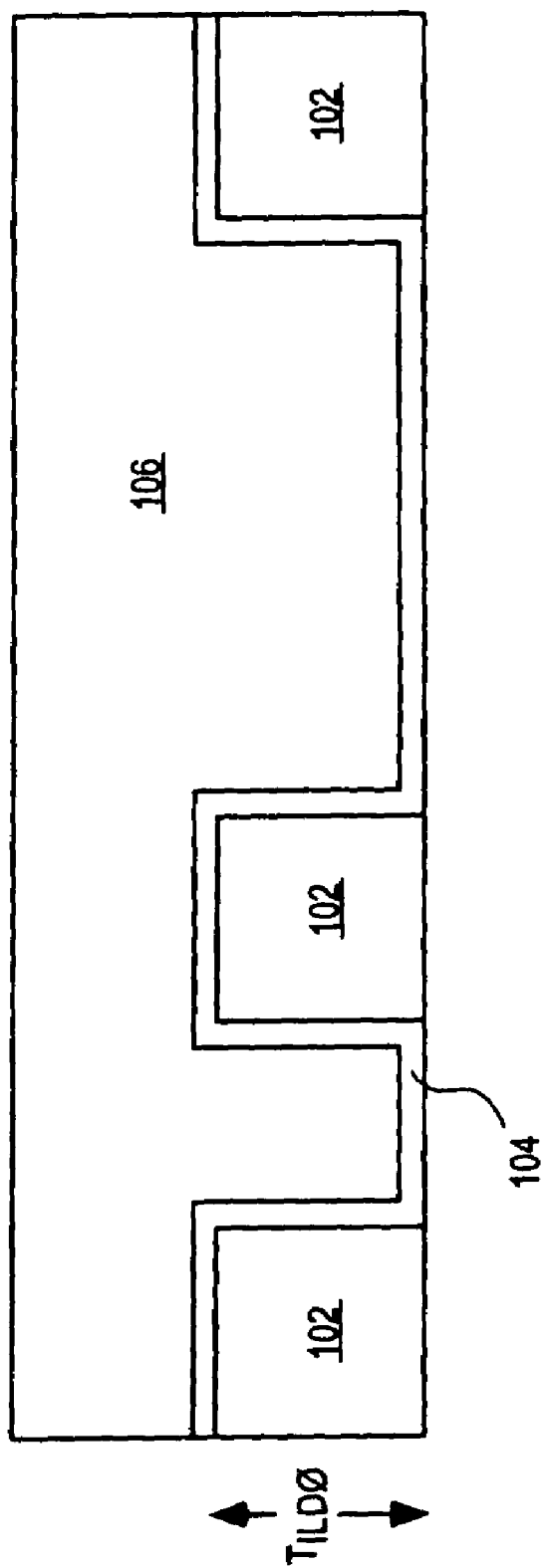
FIG. 1 is a schematic cross-sectional view of a copper damascene structure. This structure represents a post-plating, pre-polishing state of fabrication.

FIG. 1 shows a cross sectional view of a copper damascene structure. An interlayer dielectric layer (ILD) is patterned to form ILD 102 on a surface of a wafer as illustrated in the figure. ILD 102 has a thickness represented by $T_{ILDO}$ in FIG. 1. A copper diffusion barrier 104 is formed over the exposed surfaces of the wafer and ILD 102. Various materials may be used as the copper diffusion barrier. Examples of copper diffusion barriers include, but are not limited to, tantalum and tantalum nitride. Typically a copper seed layer is then formed on copper diffusion barrier 104. A complete copper layer 106 is then formed, typically by plating, over diffusion barrier 104.

Conventional methods of copper polishing for integrated circuit manufacturing include using an alumina-based, or silica-based, slurry, typically at a pH equal to or less than 7.5. Abrasives such as alumina and silica have a hardness which is greater than that of copper, and greater than that of copper diffusion barriers such as tantalum and tantalum nitride.

Slurries developed for copper CMP consist of two main constituents: the abrasive that provides the mechanical action (in combination with the pad and process parameters (e.g., pressure)); and the chemistry that maintains the pH for the process, establishes the redox potential, inhibits corrosion, improves selectivity, and so on. It is also possible for the abrasive to interact with chemistry through surface charge and surface radicals.

It is well known that polishing can occur by fluid wear or by Hertzian indentation. In the latter mechanism, abrasive particles are dragged across the polish surface acting essentially as cutting tools. During CMP both wear and indentation occur. Which mechanism predominates depends on the film properties, process conditions, chemistry, and the polish pad. However, it is clear that for hard and relatively inert films, indentation predominates.

For an abrasive particle to indent the surface of a film it must be harder that the film. The Moh's hardness is a relative hardness scale used primarily by the mineral industry. In this scale, a first material is harder than a second material if the first material scratches the second material. For example, diamond is harder than glass because diamond will scratch glass. The Moh scale is an ideal one to use for the indentation model. In accordance with the present invention, the hardness of the abrasive that should be used for a selective slurry, is that which is harder than the layer to be polished, but softer than the stopping layer. From Table 1 below, it is clear that to polish copper and stop on TaN, Ta, or SiOF, an abrasive should be used that has a Moh's hardness greater than 3.0 and less than 6.5. Moh hardness is a relative scale that is used for dry materials. CMP slurries are wet, and the hardness of the particle in the slurries may be slightly different than that of the dry numbers. Therefore the hardness range of 3.0 to 6.5 is considered an approximation.

Many CMP applications require the polishing of a first layer of material and stopping on an underlying second layer made from a different material. This second layer is sometimes referred to as a polish stop layer. For such applications, slurries have been developed that primarily focus on adjusting chemistries to achieve these requirements. Embodiments of the present invention however, achieve these goals by adjusting the mechanical, rather the chemical, properties of the slurry by choosing an abrasive having a hardness that lies between that of the layer to be polished and the polish stop layer.

Desirable attributes for a copper polish slurry are: high polish rate, low (or zero) copper etch rate, and high selectivity between the copper layer and the copper diffusion barrier layer. Alternatively, if the slurry has an adequate polish rate for the diffusion barrier, which typically underlies the copper, then the slurry should have a high selectivity to the inter-layer dielectric (ILD), which typically underlies the diffusion barrier, in order to permit continued polishing through the diffusion barrier and stopping on the ILD. A high selectivity between the copper and the copper diffusion barrier layer means that a slurry used for removal of copper by polishing with that slurry, should remove the copper without significantly polishing the underlying copper diffusion barrier layer. A copper polish slurry, in accordance with the present invention, meets these criteria for a desirable copper polish slurry. In particular, the inventive slurry includes an abrasive chosen such that the hardness of the abrasive is between that of copper and the copper diffusion barrier.

Figure 2:
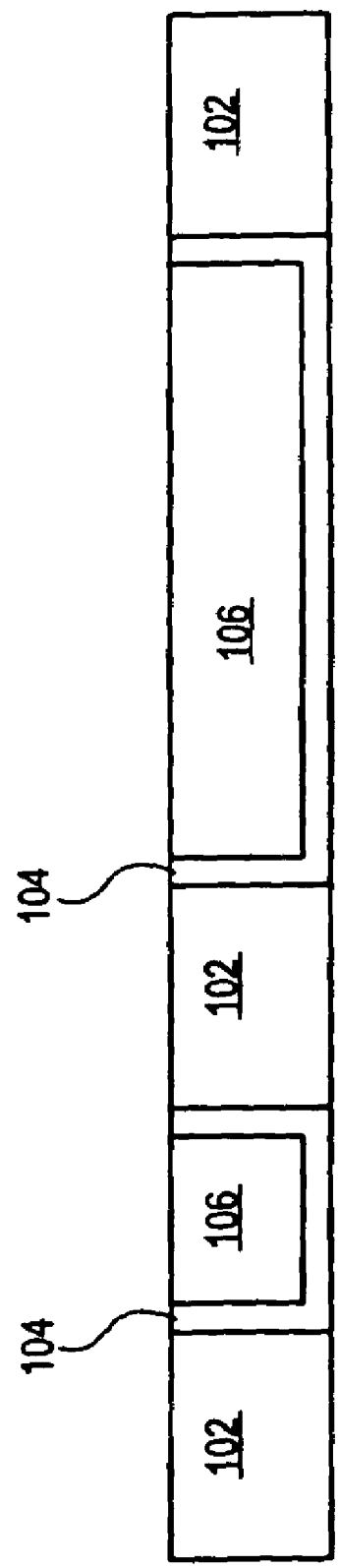
FIG. 2 is a schematic cross-sectional view of the copper damascene structure of FIG. 1 after polishing with a slurry in accordance with the present invention.

FIG. 2 is a schematic cross-sectional view of the copper damascene structure of FIG. 1 after polishing with a slurry in accordance with the present invention.

Table 1, below, shows the relative hardness of various materials in the Moh's Hardness scale, and where available, in the Microhardness scale.

TABLE 1

| Material | Moh's Hardness | Microhardness (kg mm2) |
| --- | --- | --- |
| Diamond | 10 | 10000 |
| Alumina | 9 | 2000 |
| Silica (Quartz) | 7 | 1200 |
| Hydrated Silica | | 400–500 |
| Tantalum | 6.5 | 230 |
| Iron Oxide (Red Rouge) | 6 | |
| Strontium Titanate | 5–6 | |
| Apatite | 5 | |
| Dioptase | 5 | |
| Iron | 4–5 | |
| Brass | 4 | |
| Fluorite | 4 | |
| Hydrated Iron Oxide (Yellow Rouge) | | |

TABLE 1-continued

| Material | Moh's Hardness | Microhardness (kg mm2) |
|---|---|---|
| Azurite | 3.5–4 | |
| Copper | 3 | 80 |
| Aluminum | 3 | |
| Gold | 2–3 | |
| Silver | 2–2.5 | |
| Lead | 1.5 | |
| Graphite | 1 | |

Slurry Example

An exemplary slurry, in accordance with the present invention, for chemical mechanical polishing of copper disposed over a barrier layer such as for example tantalum or tantalum nitride, includes 2 to 4 wt. % hydrogen peroxide; a corrosion inhibitor such as 0.015 to 0.045 M benzotriazole; a buffer system to maintain the pH in a range between 3.5 and 7.0; and an abrasive in the range of 0.5 to 10 wt. %. In order to achieve the desired high polish selectivity between copper and the copper diffusion barrier the abrasive must have a hardness greater than that of copper and less than that of tantalum or tantalum nitride. Abrasive materials meeting the hardness requirements of the present invention include, but are not limited to, iron oxide (sometimes referred to as red rouge), strontium titanate, apatite, dioptase, iron, brass, fluorite, hydrated iron oxide (sometimes referred to yellow rouge), and azurite. A slurry in accordance with the present invention may include one or more of the abrasives listed above, and may include one or more abrasives meeting the hardness requirements described herein. Those skilled in the art will recognize that water is also an ingredient of most slurries, and is an ingredient of the exemplary slurry as well.

Corrosion inhibitors which may be used as an alternative to benzotriazole include other forms of benzotriazole such as 5-methyl benzotriazole or 1-methyl benzotriazole, however this list is not intended to be limiting, and other suitable corrosion inhibitors may be used.

Examples of pH buffer systems include, but are not limited to, citric acid and potassium citrate; acetic acid and potassium citrate; and phosphoric acid and potassium phosphate.

In one embodiment of the present invention a slurry includes 2 wt. % abrasive, 3 wt % $H_2O_2$, 0.03 M benzotriazole, 3.0 grams/liter citric acid, 3.0 grams/liter potassium citrate, and has a pH of 3.85. More particularly, the abrasive is a hydrated $Fe_2O_3$, with a particle size of 1 to 5 microns, available as FE-605 Yellow from Atlantic Equipment Engineers, 13 Foster Street, Bergenfield, N.J. 07621.

This example is provided simply to illustrate the present invention. Those skilled in the art will appreciate that a slurry formulated in accordance with the present invention may also include some reaction products of the various ingredients.

Method

Referring to FIG. 3, a general method in accordance with the present invention is described, wherein a first material overlying a second, harder material is removed by polishing. More particularly, a slurry is provided (block 302) to a polishing pad of a polishing apparatus. Such a polishing apparatus is typically a well-known CMP apparatus. The slurry contains an abrasive that is harder than a first material and less hard than a second material. A substrate having a first layer, and a second underlying layer thereon, is brought into contact with the polishing pad (block 304). The first layer is a material that is less hard than the abrasive in the slurry, and the second layer is a material that is harder than the abrasive. The first layer is then polished (block 306) in accordance with typical CMP practices of rotating the polishing pad and substrate while supplying slurry to the polishing pad and maintaining a down-force such that the substrate and polishing pad remain in contact and the desired polishing rate is achieved. When the first layer is removed, polishing substantially stops on the second layer (block 308) because the second layer is made of a material that is harder than the abrasive, and the slurry is formulated to rely primarily on the mechanical properties of the abrasive rather than the chemical properties of the slurry.

A method of forming copper interconnect, in accordance with the present invention includes forming a dielectric layer over a substrate, the dielectric layer having trenches therein, forming a copper diffusion barrier in the trenches and on a top surface of the dielectric layer, depositing copper over the copper diffusion barrier, and polishing the copper with a slurry that includes an abrasive harder than copper and less hard than the copper diffusion barrier. In one embodiment of the present invention, the abrasive, or mixture of abrasives, are also less hard than the underlying dielectric layer. More particularly, in this illustrative embodiment of the present invention, the dielectric layer is primarily an oxide of silicon and the trenches are patterned by conventional photolithographic techniques. However, any method suitable for forming trenches may be used. The copper diffusion barrier may be any suitable material for substantially or completely preventing the diffusion of copper into the dielectric layer. Various materials, both electrically conductive and insulative have been used as copper diffusion barriers. Typical embodiments include conductive materials, such as, but not limited to, tantalum and tantalum nitride, as copper diffusion barriers. After the barrier layer is formed, a copper seed layer is typically formed on the barrier, and then copper is plated on. Subsequent to plating, the substrate, with the copper metal plated over the diffusion barrier, may be subjected to polishing in a chemical mechanical polishing (CMP) apparatus. Such CMP apparatus are known in this field. The substrate with copper metal thereon may or may not be subjected to an anneal operation prior to polishing. In accordance with the present invention, a slurry with a particular range of mechanical, or abrasive, properties, (such as described above) is provided to the CMP apparatus for the desired polishing operation. In particular, the slurry contains an abrasive having a hardness that is greater than the hardness of the copper, but less hard than the copper diffusion barrier. Exemplary polishing conditions may include a polish pressure of approximately 3.75 pounds per square inch (psi), a delta P of approximately 0.3 psi, pad revolutions per minute (rpm) of approximately 440, head rpm of approximately 9, a slurry flow of approximately 100 cubic centimeters per minute (ccm), and an FX-9, 80 mil pad from Freudenberg of Lowell, Mass.

Such a slurry and process may be used to remove, by polishing, copper and a TaN barrier layer and stop on the underlying interlayer dielectric. For, example a hydrated iron oxide (yellow rouge) abrasive is harder than copper but softer than both TaN and SiOF (although TaN is softer than SiOF), and is capable of removing the copper and the TaN since the removal rate for the TaN, although low compared to copper, is greater than that of SiOF.

Methods and slurries in accordance with the present invention may be used with various interlayer dielectric materials. For example, even though $SiO_2$ has traditionally been the dielectric material used between interconnect levels on integrated circuits, various low-k dielectric materials, including but not limited to, SiOF may also be used with embodiments of the present invention. SiOF is believed to be less hard than $SiO_2$. Likewise, TaN is believed to be less hard than Ta. The TaN typically used as a copper diffusion barrier may actually be thought of as a tantalum mixture of tantalum and nitrogen with the nitrogen content being on the order of 30 atomic %. This type of tantalum nitride is often formed by a reactive sputter operation.

Conclusion

Embodiments of the present invention provide slurries for chemical mechanical polishing of multi-layer films wherein a first layer overlies a second layer which is harder than the first layer.

An advantage of embodiments of the present invention is that the abrasive property is used to provide high selectivity.

A further advantage of embodiments of the present invention is that is polish rates for materials having different hardnesses can be tuned by selecting for use in a polish slurry, an abrasive having a hardness that lies between that of the materials to be polished.

It will be apparent to those skilled in the art that a number of variations or modifications may be made to the illustrative embodiments described above. For example, various combinations, slurry pH, slurry delivery rate, pad rotation speed, pad temperature, and so on, may be used within the scope of the present invention.

Other modifications from the specifically described apparatus, slurry, and process will be apparent to those skilled in the art and having the benefit of this disclosure. Accordingly, it is intended that all such modifications and alterations be considered as within the spirit and scope of the invention as defined by the subjoined claims.

What is claimed is:

1. A slurry, comprising:
an oxidizer;
a corrosion inhibitor;
a buffer system; and
an abrasive harder than a copper feature to be polished and less hard than a copper diffusion battier and wherein the abrasive comprises one or more materials selected from the group consisting of strontium titanate, apatite, and dioptase.

2. The slurry of claim 1, wherein the copper diffusion barrier comprises Ta.

3. The slurry of claim 1, wherein the copper diffusion barrier comprises TaN.

4. A slurry, comprising:
an oxidizer;
a corrosion inhibitor;
a buffer system; and
an abrasive harder than a copper feature to be polished and less hard than a copper diffusion barrier and wherein the abrasive comprises one or more materials selected from the group consisting of fluorite and azurite.

5. The slurry of claim 4, wherein the oxidizer comprises hydrogen peroxide comprises 2 to 4 wt. % of the slurry; and the abrasive as 0.5 to 10 wt. % of the slurry.

6. The slurry of claim 4, wherein the corrosion inhibitor comprises 0.015 to 0.045 M benzotriazole.

7. The slurry of claim 4, wherein the slurry has a pH in the range of approximately 3.5 to 7.

* * * * *

UNITED STATES PATENT AND TRADEMARK OFFICE
CERTIFICATE OF CORRECTION

PATENT NO. : 7,087,188 B2  Page 1 of 1
APPLICATION NO. : 10/360254
DATED : August 8, 2006
INVENTOR(S) : Cadien et al.

It is certified that error appears in the above-identified patent and that said Letters Patent is hereby corrected as shown below:

In column 8, at line 7, delete "battier" and insert --barrier--.

Signed and Sealed this

Thirtieth Day of October, 2007

JON W. DUDAS
*Director of the United States Patent and Trademark Office*